(12) United States Patent
Herrault et al.

(10) Patent No.: US 11,536,800 B2
(45) Date of Patent: Dec. 27, 2022

(54) METHOD AND APPARATUS TO INCREASE RADAR RANGE

(71) Applicant: HRL Laboratories, LLC, Malibu, CA (US)

(72) Inventors: Florian G. Herrault, Malibu, CA (US); Jonathan J. Lynch, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 48 days.

(21) Appl. No.: 17/207,470

(22) Filed: Mar. 19, 2021

(65) Prior Publication Data

US 2021/0208240 A1 Jul. 8, 2021

Related U.S. Application Data

(63) Continuation-in-part of application No. 16/158,212, filed on Oct. 11, 2018, now Pat. No. 10,998,273.
(Continued)

(51) Int. Cl.
*H01L 23/538* (2006.01)
*H01L 23/482* (2006.01)
(Continued)

(52) U.S. Cl.
CPC .......... *G01S 7/032* (2013.01); *H01Q 1/3233* (2013.01); *H01Q 23/00* (2013.01)

(58) Field of Classification Search
CPC .......... H01L 23/5386; H01L 23/5389; H01L 23/4827; H01L 23/367; H01L 23/13;
(Continued)

(56) References Cited

U.S. PATENT DOCUMENTS 8,017,451 B2 9/2011 Racz
8,617,927 B1 12/2013 Margomenos
(Continued)

FOREIGN PATENT DOCUMENTS

FR 2 917 234 12/2008
JP 2012-004314 A 1/2012
(Continued)

OTHER PUBLICATIONS

PCT International Search Report and Written Opinion from PCT/US2021/023510 dated Jul. 15, 2021.
(Continued)

*Primary Examiner* — Omar F Mojaddedi
(74) *Attorney, Agent, or Firm* — Ladas & Parry, LLP

(57) ABSTRACT

An integrated radar circuit comprising: a first substrate, of a first semiconductor material, said substrate comprising an integrated transmit and receive radar circuit; a second substrate, of a second semiconductor material, said second substrate comprising at least on through-substrate cavity having cavity walls; at least one discrete transistor chip, of a third semiconductor material, said at least one discrete transistor chip having chip walls and being held in said at least one through-substrate cavity by a metal filling extending from at least one cavity wall to at least one chip wall; a conductor on said second substrate, electrically connecting a portion of said integrated transmit and receive radar circuit to a discrete transistor on said at least one discrete transistor chip.

20 Claims, 6 Drawing Sheets

Related U.S. Application Data

(60) Provisional application No. 63/045,674, filed on Jun. 29, 2020, provisional application No. 62/610,099, filed on Dec. 22, 2017.

(51) Int. Cl.

| | | |
|---|---|---|
| *H01L 23/367* | (2006.01) | |
| *H01L 25/065* | (2006.01) | |
| *H01L 25/16* | (2006.01) | |
| *H01L 21/56* | (2006.01) | |
| *H01L 21/683* | (2006.01) | |
| *G01S 7/03* | (2006.01) | |
| *H01Q 1/32* | (2006.01) | |
| *H01Q 23/00* | (2006.01) | |

(58) Field of Classification Search
CPC ..... H01L 23/14; H01L 23/31; H01L 25/5386; H01L 25/0655; H01L 25/50; H01L 25/18; H01L 25/165; H01L 25/0652; H01L 21/6835; H01L 24/40; H01L 24/48; H01L 24/24; H01L 24/82; H01L 24/94; H01L 24/27; H01L 21/56
See application file for complete search history.

(56) References Cited

U.S. PATENT DOCUMENTS

| | | |
|---|---|---|
| 9,214,404 B1 | 12/2015 | Margomenos |
| 9,337,124 B1 | 5/2016 | Herrault |
| 9,385,083 B1 | 7/2016 | Herrault |
| 9,508,652 B1 | 11/2016 | Herrault |
| 9,837,372 B1 | 12/2017 | Herrault |
| 10,957,537 B2 | 3/2021 | Herrault |
| 10,998,273 B2 | 5/2021 | Herrault |
| 2001/0010398 A1 | 8/2001 | Farooq |
| 2002/0110952 A1 | 8/2002 | Gris |
| 2006/0105496 A1* | 5/2006 | Chen ............... H01L 25/0652 257/E21.597 |
| 2006/0131736 A1* | 6/2006 | Jansman ........... H01L 23/5389 257/E23.101 |
| 2007/0025092 A1* | 2/2007 | Lee .................. H01L 23/5389 361/764 |
| 2008/0224320 A1* | 9/2008 | Palmade .............. H01L 23/13 257/E23.079 |
| 2009/0251362 A1 | 10/2009 | Margomenos |
| 2011/0140216 A1 | 6/2011 | Qu |
| 2011/0266569 A1 | 11/2011 | Basin |
| 2012/0037935 A1* | 2/2012 | Yang .................. H01L 33/641 257/E33.056 |
| 2012/0319295 A1 | 12/2012 | Heejo |
| 2013/0168803 A1 | 7/2013 | Haddad |
| 2013/0182401 A1* | 7/2013 | Furutani ............. H01L 24/19 29/841 |
| 2014/0021610 A1* | 1/2014 | Von Koblinski ...... H01L 24/24 257/734 |
| 2014/0203239 A1 | 7/2014 | Schubert |
| 2014/0264808 A1 | 9/2014 | Wolter |
| 2016/0111616 A1 | 4/2016 | Margalit |
| 2016/0293557 A1 | 10/2016 | Topak |
| 2016/0308270 A1 | 10/2016 | Ding |
| 2016/0329232 A1 | 11/2016 | Golda |
| 2017/0155450 A1 | 6/2017 | Dosunmu |
| 2017/0363589 A1 | 12/2017 | Kumar |
| 2018/0019178 A1 | 1/2018 | Lin |
| 2018/0148328 A1 | 5/2018 | Agache |
| 2019/0198449 A1 | 6/2019 | Herrault |
| 2021/0233857 A1 | 7/2021 | Herrault |

FOREIGN PATENT DOCUMENTS

| | | |
|---|---|---|
| KR | 10-2013-0117329 | 10/2013 |
| KR | 10-2020-0002229 A | 1/2020 |

OTHER PUBLICATIONS

PCT International Search Report and Written Opinion from PCT/US2019/050384 dated Jan. 20, 2020.
PCT International Search Report and Written Opinion from PCT/US2018/055516 dated Feb. 1, 2019.
PCT International Preliminary Report on Patentability (Chapter I) with Written Opinion from PCT/US2018/055516 dated Jun. 23, 2020.
Chinoy, P. et al., "Manufacture of low-loss microwave circuits using HMIC technology," 1994 IEEE MTT-S International Microwave Symposium Digest (Cat. No. 94CH3389-4), San Diego, CA, USA, 1994, pp. 1137-1140 vol. 2. doi: 10.1109/MWSYM.1994.335544.
PCT International Preliminary Report on Patentability (Chapter I) with Written Opinion from PCT/US2019/050384 dated May 11, 2021.
From U.S. Appl. No. 16/158,212 (now U.S. Pat. No. 10,998,273), Notice of Allowance dated Jan. 8, 2021.
From U.S. Appl. No. 16/158,212 (now U.S. Pat. No. 10,998,273), Office Action dated Dec. 4, 2020.
From U.S. Appl. No. 16/158,212 (now U.S. Pat. No. 10,998,273), Office Action dated Jul. 29, 2020.
From U.S. Appl. No. 16/158,212 (now U.S. Pat. No. 10,998,273), Office Action dated Jan. 16, 2020.
Extended European Search Report from European Patent Application No. 18893286.7 dated Oct. 14, 2021.
PCT International Search Report and Written Opinion from PCT/US2021/024519 dated Dec. 21, 2021.

* cited by examiner

METHOD AND APPARATUS TO INCREASE RADAR RANGE

CROSS-REFERENCE TO RELATED APPLICATIONS

The present application claims priority to, and the benefit of, U.S. Provisional Patent Application No. 63/045,674, filed Jun. 29, 2020, and entitled "METHOD AND APPARATUS TO INCREASE RADAR RANGE". The present application is a Continuation In Part of U.S. application Ser. No. 16/158,211, filed Oct. 11, 2018, which claims priority to, and the benefit of, U.S. Provisional Patent Application No. 62/610,099, filed Dec. 22, 2017, and entitled "HYBRID INTEGRATED CIRCUIT ARCHITECTURE".

FIELD OF THE INVENTION

This presentation relates to radar circuits, in particular mm-wave radar circuits.

BACKGROUND

Low cost radars, such as high-frequency (>20 GHz) automotive radars, rely on high-volume semiconductor technologies (e.g., Silicon CMOS, SiGe, . . . ) for signal processing and transmit and receive channels. However, output power and noise figure of integrated circuits (ICs) are limited (e.g., low output power ~10 mW per channel, and high noise figure ~15 dB per channel for a 77 GHz silicon CMOS chipset radar). The radar range and resolution are directly related to how much transmit power the radar generates and how much noise the receive side generates. There exists a need for increasing output power and decreasing noise figure without using expensive MMIC chipsets, to manufacture low-cost long-range high-performance radars.

SUMMARY

This presentation describes a novel method to improve performance (range and resolution) of mm-wave radars, by co-integration of high-volume and low-cost semiconductor technologies (e.g., Si CMOS) with III-V RF transistors. This presentation also describes a novel radar device manufactured using such novel method, that can be suitable for level five autonomous driving vehicles. This presentation relates to a method and apparatus to increase high-frequency radar range and resolution using high-performance transistor chiplets (or chips) co-integrated with traditional CMOS chipsets by means of a low-cost interposer. In particular, this presentation relates to integrating high performance semiconductors, such as GaAs, InP, and GaN, directly with low-cost ICs (e.g., Silicon CMOS, SiGe) in a manner that does not substantially increase the overall cost of the integrated circuits.

Embodiments according to this presentation comprise a mm-wave radar circuit comprising: an integrated circuit (e.g., Silicon CMOS, SiGe IC) transmit and receive chip; high-performance (e.g., InP, GaAs, or GaN HEMT) transistor chips; and an interposer between the IC chip and the transistor chips, wherein the transistor chips are embedded in the interposer using a metal electroforming process, and the interposer has RF front end passive circuitry (power amplifier and low noise amplifier). Embodiments according to this presentation comprise a mm-wave radar comprising the above circuit and an assembly board with at least one antenna coupled to said circuit. Embodiments according to this presentation comprise a mm-wave radar integrated circuit having a CMOS transmit and receive chip with embedded RF GaN chips. According to embodiments of this presentation, the circuit further comprises an on-chip antenna.

Embodiments according to this presentation comprise an integrated radar circuit having: a first substrate, of a first material, said first substrate comprising an integrated transmit and receive radar circuit; a second substrate, of a second material, said second substrate comprising at least one through-substrate cavity having cavity walls; at least one discrete transistor chip, of a third material, said at least one discrete transistor chip having chip walls and being held in said at least one through-substrate cavity by direct contact with a metal filling extending from at least one cavity wall to at least one chip wall; a conductor on said second substrate, electrically connecting a portion of, said integrated transmit and receive radar circuit to a discrete transistor on said at least one discrete transistor chip; wherein the first material is a first semiconductor material and the third material is a third semiconductor material. According to embodiments of this presentation, the first and second substrate form a single substrate and the first and second materials are a same semiconductor material. According to embodiments of this presentation, the first material is Silicon and the third material is a III-V semiconductor. According to embodiments of this presentation, the third material is GaN. According to embodiments of this presentation, the first and second substrates are attached to a third substrate.

According to embodiments of this presentation, the circuit comprises an antenna electrically coupled to said discrete transistor. According to embodiments of this presentation, the antenna is formed on said second substrate. According to embodiments of this presentation, passive circuit elements electrically coupled to said discrete transistor are formed on said second substrate, wherein said passive circuit elements form at least an impedance matching circuit.

According to embodiments of this presentation, said at least one discrete transistor chip comprises a plurality of discrete transistor chips having each discrete transistor chip walls; each at least one discrete transistor chip being held in said at least one through-substrate cavity by direct contact with said metal filling; said metal filling extending from at least one cavity wall to at least one wall of said discrete transistor chip; or extending from at least one wall of said, discrete transistor chip to at least one wall of a neighboring discrete transistor chip; the discrete transistor chips comprising each discrete transistors and being connected electrically to form a power amplifier. According to embodiments of this presentation, each discrete transistor of a discrete transistor chip comprises a plurality of discrete transistors connected in parallel to a single current input terminal, a single current output terminal, and a single control terminal. According to embodiments of this presentation, said integrated transmit and receive radar circuit comprises RF I/O terminals of said integrated transmit and receive radar circuit.

Embodiments of this presentation also comprise a method of manufacturing an integrated radar circuit, the method comprising: providing a first substrate, of a first material, on which is formed an integrated transmit and receive radar circuit; providing a second substrate, of a second material, comprising at least one through-substrate cavity having cavity walls; providing at least one discrete transistor chip, of a third material, on which is formed at least one discrete transistor, said at least one discrete transistor chip having chip walls; attaching said at least one discrete transistor chip in said through-substrate cavity with a metal filling extending from at least one cavity wall to at least one chip wall; forming on said second substrate a conductor electrically connecting a portion of said integrated transmit and receive radar circuit to said discrete transistor; wherein the first material is a first semiconductor material and the third material is a second semiconductor material.

According to embodiments of this presentation, said attaching said at least one discrete transistor chip in said through-substrate cavity with a metal filling comprises: temporarily attaching a top surface of said second substrate to a carrier wafer; temporarily attaching a top surface of said at least one discrete transistor chip to said carrier wafer in said through-substrate cavity; filling at least a portion of said though-substrate cavity with said metal filling; and removing said carrier wafer. According to embodiments of this presentation, the first and second substrates form a single substrate and the first and second materials are a same semiconductor. According to embodiments of this presentation, the first material is Silicon and the third material is a III-V semiconductor. According to embodiments of this presentation, the method comprises forming an antenna on said second substrate, and electrically coupling said antenna to said discrete transistor. According to embodiments of this presentation, the method comprises forming, on said second substrate, passive circuit elements electrically coupled to said discrete transistor, said passive circuit elements forming an impedance matching circuit.

According to embodiments of this presentation, said providing at least one discrete transistor chip comprises providing a plurality of discrete transistor chips each attached by the metal filling in the through wafer substrate of the second substrate; and connecting discrete transistors on said discrete transistor chips to form a power amplifier. According to embodiments of this presentation, each discrete transistor of a discrete transistor chip comprises a plurality of discrete transistors connected in parallel to a single current input terminal, a single current output terminal, and a single control terminal. According to embodiments of this presentation, said attaching said at least one discrete transistor chip in said through-substrate cavity with a metal filling comprises; temporarily attaching a top surface of said second substrate to a carrier wafer; temporarily attaching a top surface of each discrete transistor chip to said carrier wafer in said through-substrate cavity; filling at least a portion of said though-substrate cavity with said metal filling, such that each discrete transistor chip be held in said through-substrate cavity by said metal filling extending from at least one cavity wall to at least one wall of said discrete transistor chip; or extending from at least one wall of said discrete transistor chip wall to at least one wall of a neighboring discrete transistor chip; and removing said carrier wafer.

This Summary is provided to introduce a selection of concepts in a simplified form that are further described below in the Detailed Description.

BRIEF DESCRIPTION OF THE DRAWINGS

Various embodiments in accordance with the present disclosure will be described with reference to the drawings, in which.

The figures are drawn to clearly illustrate the relevant aspects of the embodiments and are not necessarily drawn to scale.

DETAILED DESCRIPTION

Specifically, embodiments of this presentation provide for creating an integrated radar circuit by integrating RF GaN transistor chips into a low-cost interposer wafer (or CMOS wafers) using a metal-embedded chip assembly process such as detailed in co-pending U.S. application Ser. No. 16/158,212, which is hereby incorporated by reference (hereafter the MECAMIC (Metal Embedded Chip Assembly for Microwave Integrated Circuits) process). According to embodiments of this presentation, each "chiplet" or "chip" can be a semiconductor chip comprising only one transistor cell (a transistor cell can comprise a single transistor or a plurality of transistors connected in parallel) having a single current input terminal (e.g. source terminal), a single current output terminal (e.g. drain terminal), and a single control terminal (e.g. gate terminal). According to embodiments of this presentation, each terminal can comprise a conductive terminal pad, such as a metallic pad formed on a top surface of the chip. According to embodiments of this presentation, the terminal pads of the chips can be devoid of impedance adaptation circuitry and/or devoid of protection circuitry (as opposed to the well-known contact pads of integrated circuits, which can comprise such impedance adaptation and/or protection circuitry).

Figure 1:
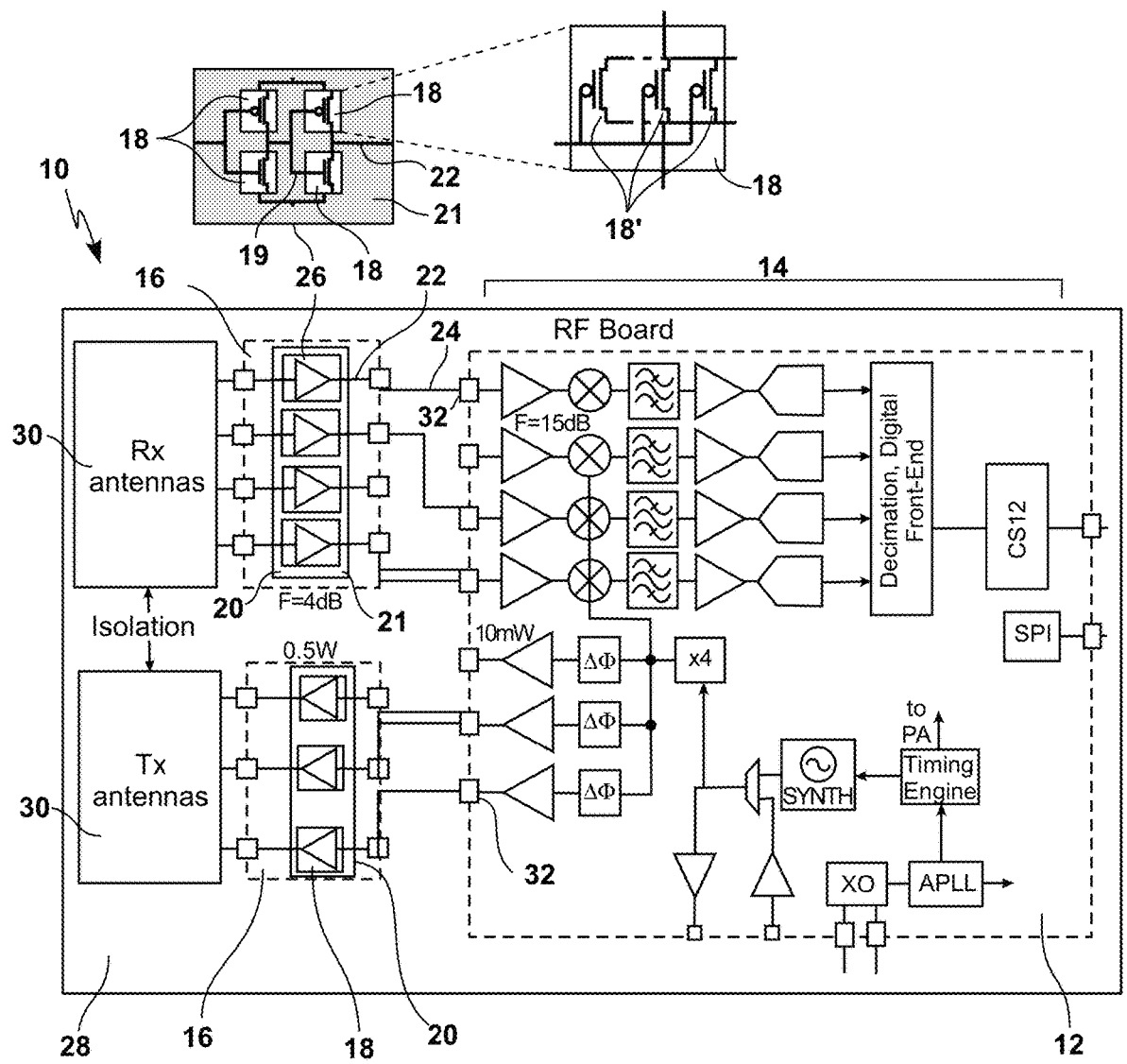
FIG. 1 illustrates schematically a top view of an integrated radar circuit according to embodiments of this presentation.

A method according to this presentation allows manufacturing an integrated Transmit and Receive radar circuit having an output power improved over the output power of a traditional technology CMOS Transmit and Receive module radar chip by 100×, and a Noise Figure reduced with respect to the Noise Figure of the same radar chip by 10 dB. Embodiments of a method according to this presentation comprise using the MECAMIC process to add some power amplifiers and low noise amplifiers that use traditional GaN transistor technology to a low cost, for example CMOS, integrated transmit and receive radar circuit (FIG. 1). According to embodiments of this presentation, such a method can lead to improvements in range of over 3× while retaining the advantages of advanced CMOS for high circuit functionality and without substantially increasing costs.

A circuit according to embodiments of this presentation comprises an integrated mm-wave radar circuit having a range that is increased by using RF GaN transistor chips integrated into a low-cost interposer using the above-described MECAMIC process.

FIG. 1 illustrates schematically a top view of an integrated radar circuit 10 according to embodiments of this presentation, comprising: a first substrate 12, made of a first semiconductor material and comprising an integrated transmit and receive radar circuit 14; a second substrate or interposer wafer 16, made of a second material, which can be a semiconductor material, and comprising at least one through-substrate cavity 20, wherein at least one discrete transistor chip 18 is embedded. According to embodiments of this presentation, the discrete transistor chip comprises a discrete transistor that can be a high power and/or low-noise transistor. According to embodiments of this presentation, the discrete transistor chip comprises two pluralities of discrete transistor chips: a first plurality of chips where the discrete transistors are power transistors, connected as an emitter amplifier and a second plurality of chips where the discrete transistors are low-noise transistors connected as a receipt amplifier. A "high power" and/or "low noise" transistor is a transistor capable of transmitting 2 times more power, and/or with a noise 2 times smaller than a transistor of a same order of size made in the technology of the integrated transmit and receive radar circuit. According to embodiments of this presentation, the at least one discrete transistor chip 18 is held embedded in the at least one through-substrate cavity 20 by direct contact with a metal filling 21 that extends from the walls of the at least one through-wafer cavity 20 to the walls of the at least one discrete transistor chip 18. According to embodiments of this presentation, the at least one discrete transistor chip 18 is made of a semiconductor material that is different from the first semiconductor material and the second material. According to embodiments of this presentation, at least one conducting line 22 is formed on a surface of the second substrate/interposer wafer 16 and is part of an electrical conductor 24 between a portion of integrated transmit and receive radar circuit 14 and discrete transistor chip 18.

According to embodiments of this presentation, and as illustrated in FIG. 1, the at least one discrete transistor chip 18 effectively comprises a plurality of discrete transistor chips 18; and each discrete transistor chip 18 is held in the at least one through-substrate cavity 20 by direct contact with the metal filling 21 extending, depending on the location of the discrete transistor chip 18 in cavity 20, either from a cavity wall to a wall of the discrete transistor chip 18; or extending from a wall of discrete transistor chip 18 to a wall, of a neighboring discrete transistor chip 18.

According to an embodiment of this presentation, the discrete transistor chips 18 can be connected together by conductors 19, such as bonded wire or strip conductors, to form a power amplifier 26. A four-transistor, non-inverting power amplifier 26 is illustrated in FIG. 1, but any other appropriate one, two, three, . . . transistor, inverting/non-inverting power amplifier (not shown) can also be used. According to this presentation, the discrete transistor chips 18 have each terminal pads (not shown), and are embedded in cavity 20 (one cavity for multiple chips or one cavity per chip) by filling the cavity around the discrete transistor chips 18 with metal filling 21 such that their terminal pads are accessible, for example from the top surface of interposer wafer 16. Metal filling 21 can for example be formed using an electroforming process. According to embodiments of this presentation, once the discrete transistor chips 18 are embedded, the terminal pads of the discrete transistor chips 18 can be connected (using for example bonding wires or strips) to form amplifiers 26, such as for example illustrated in FIG. 1 (e.g. power amplifiers with discrete transistors that are power transistors or low noise amplifiers with discrete transistors that are low noise transistors). According to embodiments of this presentation, the metal filling is formed around the chips 18 while chips 18 are attached by their top surface to a carrier wafer that also attaches interposer wafer 16, such that once metal 21 is formed and the carrier wafer is removed, top surfaces of the interposer wafer and chips 18 are flush or substantially flush, which eases interconnection of the chips 18.

According to embodiments of this presentation, the interposer wafer 16 can have as many through-substrate cavities 20 as there are discrete transistor chips 18 to be embedded. According to embodiments of this presentation, the interposer wafer 16 can have fewer through-substrate cavities 20 than there are discrete transistor chips 18 to be embedded in the interposer wafer 16, in which case at least two discrete transistor chips 18 can be embedded together in a single through-substrate cavity, as for example described above.

As illustrated in FIG. 1, according to embodiments of this presentation, the "discrete transistor" of each discrete transistor chip 18 comprises a plurality of discrete transistors 18' connected in parallel to a single current input terminal (source illustrated), a single current output terminal (drain illustrated and a single control terminal (gate illustrated). HEMT transistors are shown in FIG. 1, but other transistor, types such as FET, Bipolar, MOS can also be used according to embodiments of this presentation.

According to embodiments of this presentation, the first and second semiconductors are Silicon and the third semiconductor is a III-V semiconductor, for example GaN. According to, embodiments of this presentation, the first and second substrates 12, 16 are attached to a third substrate 28. Substrate 28 can be an integrated substrate or a printed wiring hoard. According to embodiments of this presentation, circuit 10 comprises at least one antenna 30 electrically coupled to power amplifiers 26.

According to embodiments of this presentation, integrated transmit and receive radar circuit 14 comprises RF I/O terminals 32 for said integrated transmit and receive radar circuit 14.

As outlined above, discrete transistor chips 18 can comprise GaN power and/or low noise transistor chips, and integrating such GaN chips with high-performance low-cost Si integrated circuits for mm-wave radar such as circuit 14 (in other words a co-integration of Si CMOS and III-V RF transistors) allows maintaining low cost production (the area of discrete transistor chips 18 can be very small, for example of the order of 100 um×100 um); and allows improving performance (range and noise figure) of mm-wave radars, compared to what could be obtained with known mm-wave radars of a same order of price.

Embodiments of this presentation comprise a Transmit and Receive circuit for high-performance mm-wave radar with increased range. A circuit such as illustrated in FIG. 1 comprises a CMOS driver circuit 14 and integrated RF GaN transistor chips 18 that provide increased output power (transmit side) and reduced noise figure (receive side) when coupled with the CMOS driver circuit 14 through means of interconnects and passives (not shown, in FIG. 1) in the interposer wafer 16. Thus, a method according to this presentation for manufacturing a circuit such as circuit 10 of enables fabricating compact and high-performance circuits with negligible increase in chipset cost.

Combining high-frequency chipsets (such as GaN MMIC) with CMOS drivers enables improved circuit performance. At mm-wave (e.g., 77 GHz), GaN HEMI technology has record output power and power added efficiency when compared against other technologies (e.g., CMOS, InP, GaAs). However, the cost of the high-frequency high-performance GaN MMICs (Monolithic Microwave Integrated Circuits) are prohibitively expensive for commercial applications. This presentation addresses this barrier by integrating III-V (e.g. GaN) chips with a CMOS chip or chipset, where the CMOS chip is used as a driver for the III-V chips and the III-V (e.g. GaN) chips form RF Front End. Because the GaN chips can have a small (~100×100 um) area, their production yield is high and their cost is low. In contrast, traditional GaN MMIC are large (1 to 5 mm at these frequencies and output power level of e.g. 0.5-1W at 77 GHz which corresponds to 100× larger area than the chips). They also have a longer manufacturing cycle time and have lower yield (larger die size).

According to embodiments of the presentation, such as illustrated in FIG. 1, the chips are integrated to at least one interposer wafer 16 that is connected to the (e.g. CMOS) chip 12. Two interposer wafers 16 (one for transmission and one for reception) are actually illustrated in FIG. 1. However, and as detailed hereafter, according to embodiments of the presentation, the interposer wafer 16 can alternatively form part of the chip 12.

Figure 2:
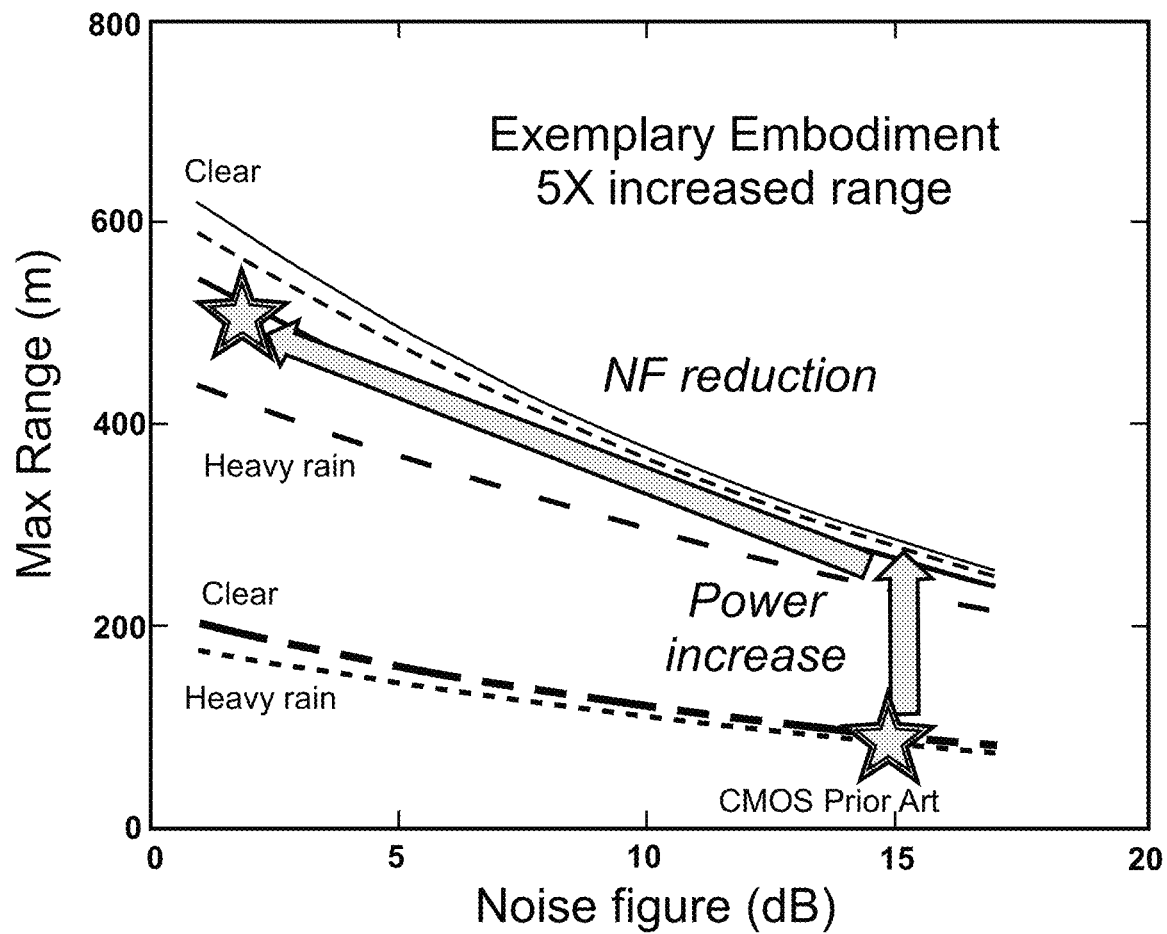
FIG. 2 illustrates the performance of art integrated radar circuit according to embodiments of this presentation.

FIG. 2 illustrates performance improvements achieved when combining high-performance GaN transistors in transistor chips 18 with a commercial CMOS Transmit and Receive chip 12 at e.g. 77 GHz, in a circuit according to embodiments of this presentation. In particular, FIG. 2 shows the range at which a minimum. SNR is obtained as a function of noise figure (i.e., noise factor in dB), for various atmospheric attenuation values (from "clear" atmosphere to "heavy rain") and output power levels. Minimum SNR depends on the application, but it can for example be of the order of 15 dB. FIG. 2 shows that compared to a pure CMOS 77 GHz radar circuit, a circuit according to embodiments of this presentation allows achieving a detection range increased by five-fold and a noise figure divided by 6. As a note, resolution can alternatively be used as a performance metric in addition to range, instead of the noise figure. Since resolution goes as the square root of SNR, a 1000× increase in SNR gives a 30× increase in resolution. The example illustrated is for a specific number of Transmit and Receive channels (12 Transmit channels and 16 Receive channels). The values used for GaN performance are typical for the GaN chips [see K. Shinohara et al., "Scaling of GaN HEMTs and Schottky Diodes for Submillimeter-Wave MMIC Applications," in IEEE Transactions on Electron Devices, vol. 60, no. 10, pp. 2982-2996, October 2013]. Using the GaN chips to boost performance, the noise figure NF is reduced and the output power is increased. The radar range thus goes from 100 m to 500 m in this example. To generate the curves in FIG. 2, the following well-known radar range equation for signal to noise ratio (SNR) was used:

$$SNR = \frac{P_{Tx} G^2 \lambda^2 \sigma 2T \alpha_{atm}^2}{(4\pi)^3 R^4 k_B T_o F} \quad (1)$$

Where $P_{Tx}$ is the transmitted power, G is the (one-way) antenna gain, λ is the wavelength, σ is the target radar cross section, T is the observation time, $\alpha_{aim}$ is the attenuation due to atmospheric losses (one-way), R is the target range, $k_B$ is Boltzmann's constant, $T_o$ is the reference temperature (290K), and F is the receiver noise factor. The equation clearly demonstrates that the SNR is proportional to output power and inversely proportional to noise factor. One may ascertain the maximum range by assuming a minimum acceptable SNR (e.g., 15 dB) and other parameter values, and then computing the range using formula (1) above.

Figure 3:
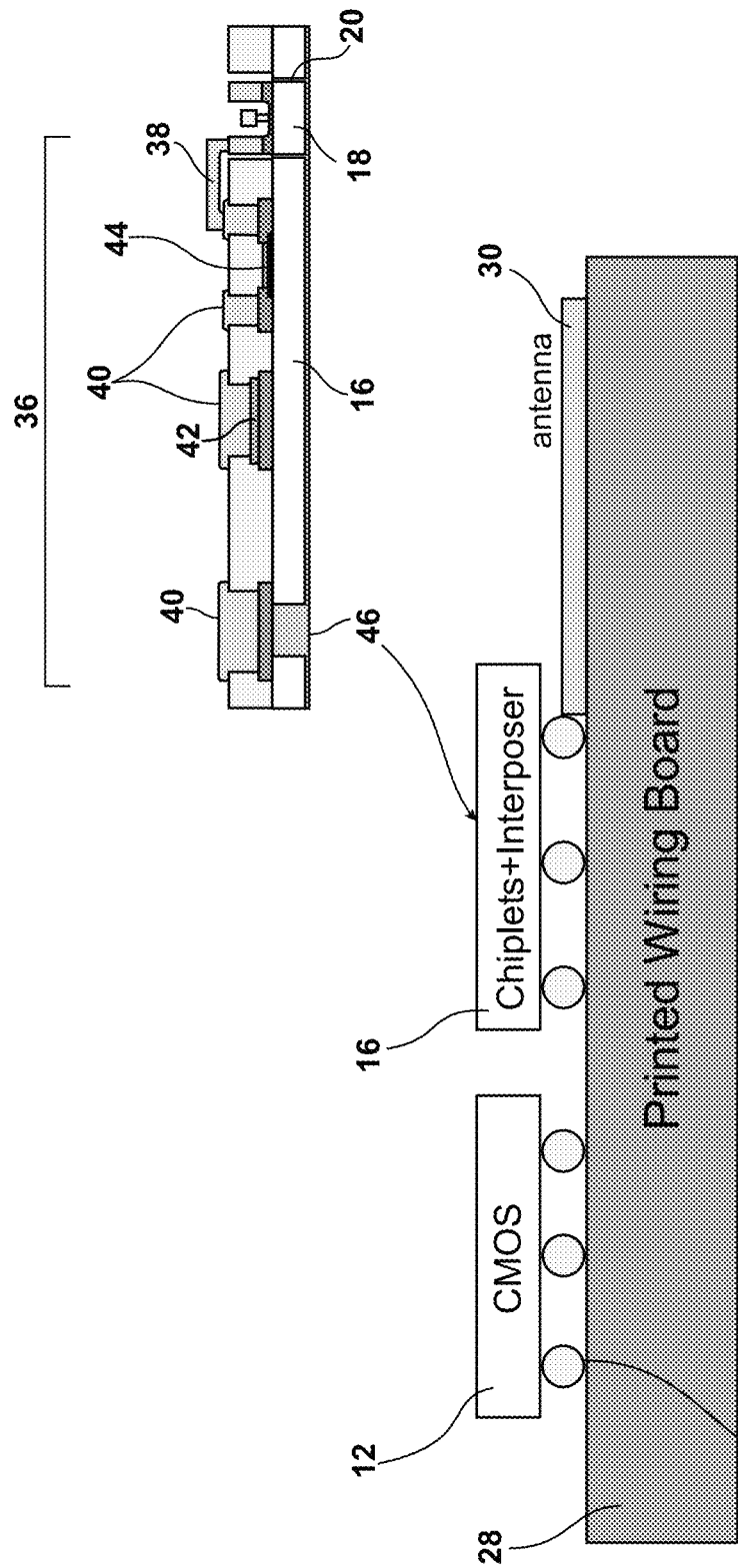
FIG. 3 illustrates a cross section of an integrated radar circuit according to first embodiments of this presentation.

FIG. 3 illustrates a cross section of a circuit 10 such as illustrated in FIG. 1, showing that substrate 12 and 16 can both be attached to substrate 28 using ball bonding connections 34. As shown in FIG. 3, passive circuit elements 36 are formed on interposer, wafer/substrate 16 and electrically coupled to discrete transistor chip 18, where chip 18 can comprise one or more GaN discrete transistors formed on a SiC chip. According to embodiments of this presentation, passive elements 36 can comprise metal conductors 38 formed on substrate 16, for example using masks and sputtering, after discrete transistor chip 18 is embedded in the through-substrate cavity 20 of substrate 16, metal conductors 40 formed on substrate 16, for example using masks and sputtering, before discrete transistor chip 18 is embedded in the through-substrate cavity 20 of substrate 16, capacitors 42 formed by forming successively conductive layers and dielectric layers on substrate 16, resistors 44 using a thin-film formed on substrate 16, and vias 46 passing through substrate 16 for a ball-bond connection underneath substrate 16. According to embodiments of this presentation, passive elements 36 form an impedance matching circuit connected to at least one transistor of transistor chip 18. Importantly, embedding chip 18 to the interposer wafer/substrate 16 before connecting the transistors in chips 18 to circuits in interposer wafer/substrate 16 allows to precisely control the impedance of the connections from and to the transistors on chips 18. Further, as the chips 18 are embedded in the interposer wafer/substrate 16 using metal, a significant portion of the heat generated by the transistors in chips 18 is dissipated into the interposer wafer/substrate 16, thus advantageously helping cool the chips 18.

Figure 4:
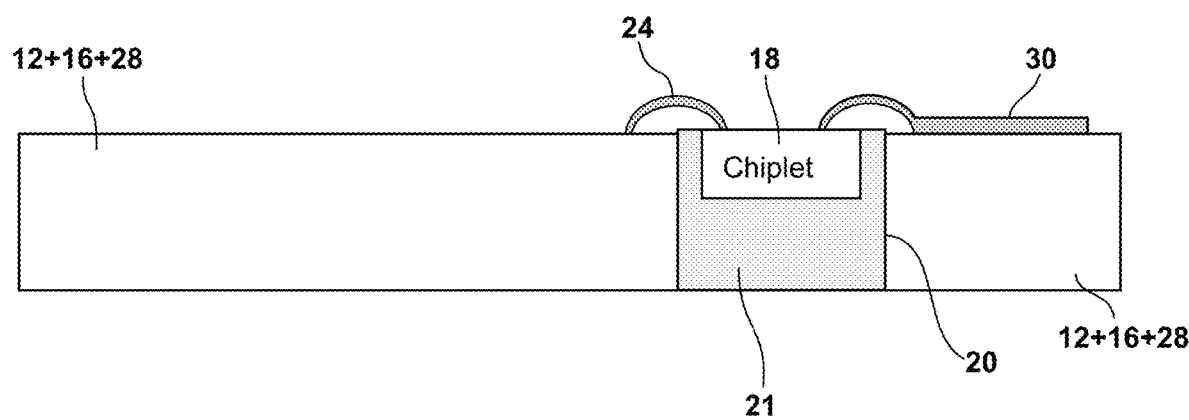
FIG. 4 illustrates a cross section of an integrated radar circuit according to second embodiments of this presentation.

FIG. 4 illustrates a cross section of an alternative embodiment of a circuit 10 according to this presentation, which is essentially identical to the embodiment of FIG. 3, except that substrates 12 and 16 and 28 are a single substrate 12+16+28. It is to be noted that in FIG. 4, filling metal 21 is shown optionally filling the entirety of cavity 20. Such optional feature can be implemented to ease a transfer of heat from the chips 18 to the bottom surface of the substrate (12+16+28), where a radiator device (not shown) can be connected to filling metal 21. Because in this embodiment, both the backend circuitry and the RF front-end (including antenna) are designed on the same wafer (i.e. the interposer wafer forms a part of the CMOS chip), this embodiment is advantageously compact and the GaN chips are integrated per the procedure described in FIG. 5. Advantageously, in such an embodiment, additional chip space is freed as the CMOS circuit 14 does not need to have RF I/O connection pads, contrary to the embodiment illustrated in FIG. 3, where such connections pads are desirable.

According to embodiments of this presentation and as illustrated in FIG. 4, an antenna or antennas 30 can be manufactured on a surface of the CMOS chip 12+16+28. In such embodiments the locations in the CMOS chip 12+16+28 for embedding the chips 18 are provided for physically arranging the chips 18 between the CMOS RF I/O conductors of circuit 14 and the antenna (or antennas) 30.

Figure 5:
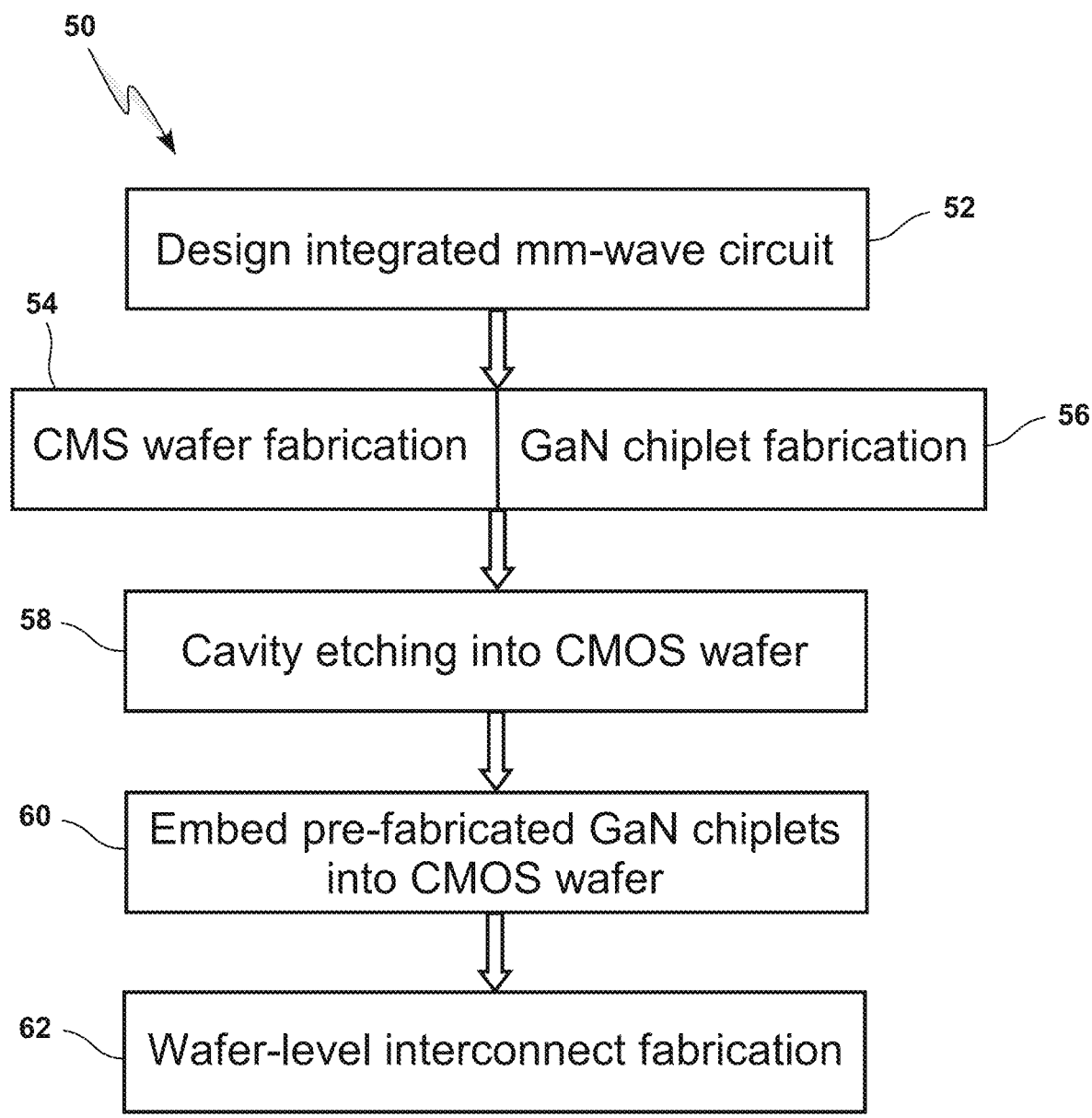
FIG. 5 illustrates a method according to embodiments of this presentation.

FIG. 5 is a flow chart of a method 50 according to embodiments of this presentation, to design and fabricate circuits such as detailed above in relation with FIG. 4, for example circuits comprising mm-wave long-range radar circuits 14 with integrated GAN transistor chips 18. Method 50 comprises designing 52 radar circuit 14 (a min-wave radar circuit in the illustrated example), then fabricating 54 the radar circuit 14 on substrate 12+16+28 (a CMOS circuit 14 on a Si wafer in the illustrated example) and also fabricating 56 the discrete transistor chips 18 (GaN transistor chips in the illustrated example). Once circuit 14 has been fabricated, method 50 comprises etching 58 the at least one through-wafer cavity 20 in substrate 12+16+28, then embedding 60 the discrete transistor chips 18 in the at least one cavity 20 using for example the MECAMIC process detailed in co-pending U.S. application Ser. No. 16/158,212.

Method 50 then comprises forming conductors between portions of circuit 14 and the discrete transistor chips 18, for example to form power amplifiers with the transistors in chips 18 as detailed in relation with FIG. 1 in I/O of circuit 14. The conductors can for example be formed using the MECAMIC process detailed in co-pending U.S. application Ser. No. 16/158,212.

Method 50 can be modified, mutatis mutandis, to fabricate a circuit such as illustrated in FIG. 3, in which case substrate 16 can be fabricated concurrently with substrate 12 and circuit 14, and cavity 20 will be formed in substrate 16. Further steps will comprise fabricating substrate 28, and connecting substrates 12 and 16 on substrate 28.

Figure 6A:
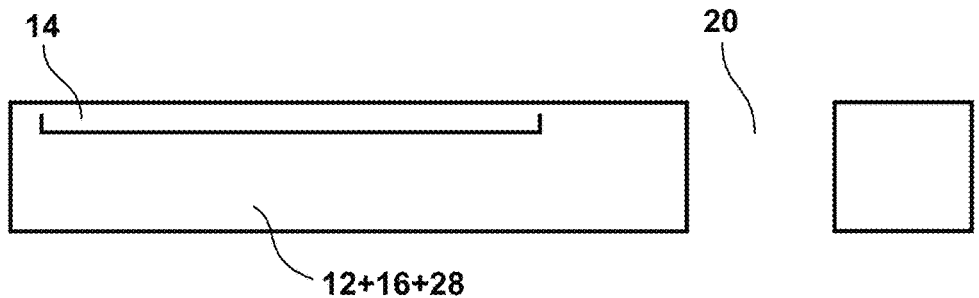
FIGS. 6A to 6D illustrate a portion of a method according to embodiments of this presentation.
Figure 6B:
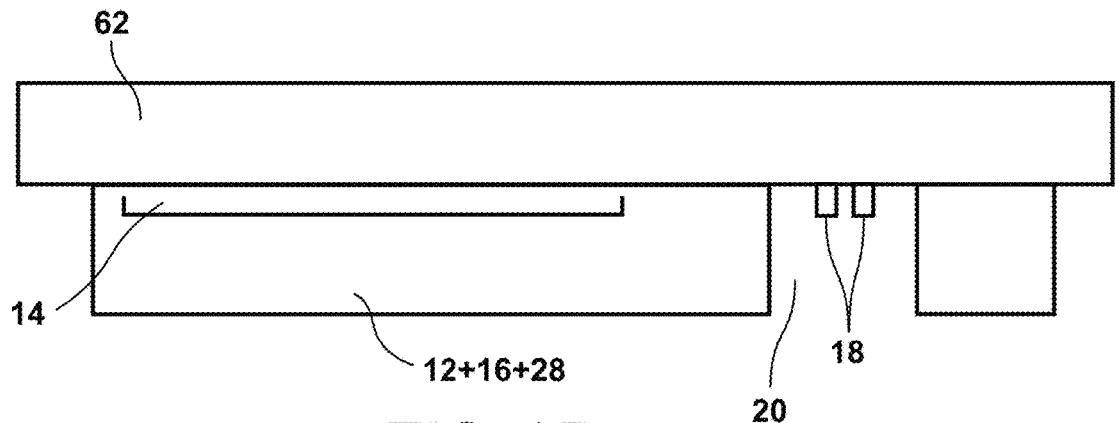

FIGS. 6A to 6D show a cross section of a substrate 12+16+28 such as illustrated in FIG. 4 during a number of the fabrication steps of method 50 as detailed in relation with FIG. 5. FIG. 6A shows the substrate 12+16+28, having circuit 14 formed on a top surface and at least one through-substrate cavity 20 formed, for example at the end of step 54 of method 50. FIG. 6B shows the top surface of substrate 12+16+28 temporarily attached to a carrier wafer 62. As illustrated in FIG. 6B, discrete transistor chips 18 (two illustrated) are also attached temporarily (for example using adhesive) by their top surface to carrier wafer 62. As outlined previously, the substrate can comprise as many cavities 20 as there are chips 18, or a plurality of chips 18 can be arranged in a single cavity 20.

Figure 6C:
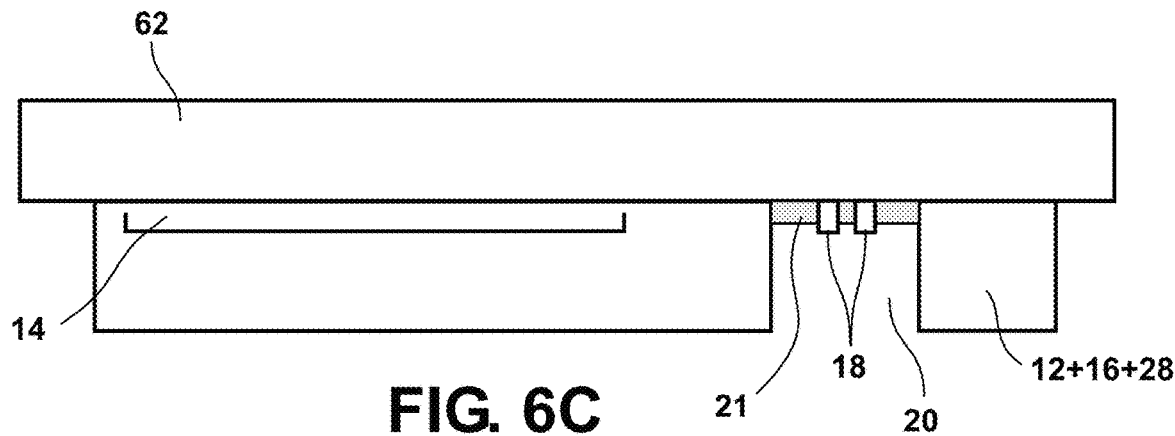

FIG. 6C shows the same structure as in FIG. 6B, where additionally a metal filling 21 has been formed between the walls of the cavity 20 and the walls of the chips 18, such that the chips 18 are maintained in position in the cavity 20 by the metal filling 21 extending from the walls of the cavity to the walls of the chips, or alternatively between the walls of neighboring chips in case of multiple chips 18 arranged in a single cavity 20. According embodiments of this presentation, metal filling 21 can also cover a part, or the whole, of the bottom surfaces of chips 18 (not shown in FIG. 6C). This can advantageously allow evacuating the heat produced by the chips 18, as detailed hereabove.

Figure 6D:
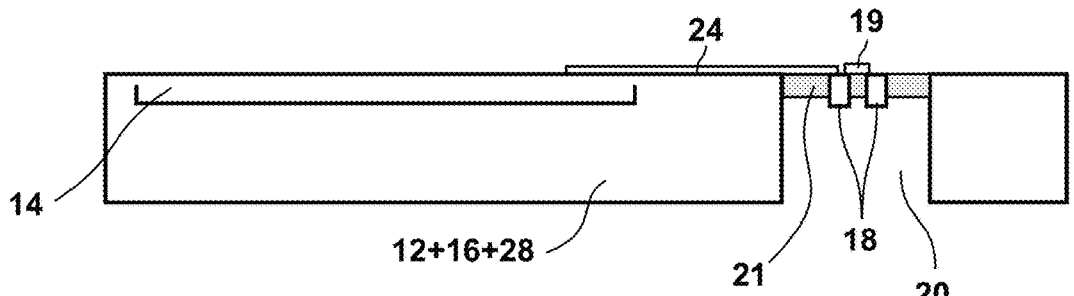

FIG. 6D shows the same structure as in FIG. 6C, where carrier wafer 62 has been removed, and where conductors 19, 24 have been formed on the top surface of the circuit, respectively to form an amplifier with the transistors of chips 18 and to connect the amplifier to input or output terminals of radar circuit 14. A passivation layer (not shown) can be formed on top of the combined top surfaces of substrate 12+16+28, metal filling 21 and chips 18 before etching said passivation layer where appropriate to allow conductors 19, 24 to not be shorted to metal filling 21.

Advantageously, as both the chips 18 and substrate 12+16+28 are attached by their top surfaces to carrier wafer 62 when metal filling 21 is formed, the top surfaces of chips 18 and substrate 12+16+28 are essentially flush once carrier wafer 62 is removed, which facilitates forming conductors 19 and 24.

It is to be noted that FIGS. 6A to 6D can be changed, mutatis mutandis, to show a cross section of a substrate 16 such as illustrated in FIG. 3 during the same fabrication steps of method 50.

All elements, parts and steps described herein are preferably included. It is to be understood that any of these elements, parts and steps may be replaced by other elements, parts and steps or deleted altogether as will be obvious to those skilled in the art The foregoing description has been presented for purposes of illustration and description and is not intended to be exhaustive or to limit the invention to the precise form disclosed. Many modifications and variations are possible in light of the above teaching. The embodiments disclosed were meant only to explain the principles of the invention and its practical application to thereby enable others skilled in the art to best use the invention in various embodiments and with various modifications suited to the particular use contemplated. The scope of the invention is to be defined by the following claims.

The invention claimed is:

1. An integrated, radar circuit comprising:
   a first substrate, of a first material, said first substrate comprising an integrated transmit and receive radar circuit;
   a second substrate, of a second material, said second substrate comprising at least one through-substrate cavity having cavity walls;
   at least one discrete transistor chip, of a third material, said at least one discrete transistor chip having chip walls and being held in said at least one through-substrate cavity by direct contact with a metal filling extending from at least one cavity wall to at least one chip wall;
   a conductor on said second substrate, electrically connecting a portion of said integrated transmit and receive radar circuit to a discrete transistor on said at least one discrete transistor chip; wherein
   the first material is a first semiconductor material and the third material is a third semiconductor material.

2. The circuit of claim 1, wherein the first and second substrate form a single substrate and the first and second materials are a same semiconductor material.

3. The circuit of claim 2, wherein the first material is Silicon and the third material is a III-V semiconductor.

4. The circuit of claim 3, wherein the third material is GaN.

5. The circuit of claim 1, wherein the first and second substrates are attached to a third substrate.

6. The circuit of claim 1, comprising an antenna electrically coupled to said discrete transistor.

7. The circuit of claim 6, wherein said antenna is formed on said second substrate.

8. The circuit of claim 1, wherein passive circuit elements electrically coupled to said discrete transistor are formed on said second substrate, wherein said passive circuit elements form at least an impedance matching circuit.

9. The circuit of claim 1, wherein said at least one discrete transistor chip comprises a plurality of discrete transistor chips having each discrete transistor chip walls; each at least one discrete transistor chip being held in said at least one through-substrate cavity by direct contact with said metal filling; said metal filling extending from at least one cavity wall to at least one wall of said discrete transistor chip; or extending from at least one wall of said discrete transistor chip to at least one wall of a neighboring discrete transistor chip; the discrete transistor chips, comprising each discrete transistors and being connected electrically to form a power amplifier.

10. The circuit of claim 9, wherein each discrete transistor of a discrete transistor chip comprises a plurality of discrete transistors connected in parallel to a single current input terminal, a single current output terminal, and a single control terminal.

11. The circuit of claim 1, wherein said integrated transmit and receive radar circuit comprises RF I/O terminals of said integrated transmit and receive radar circuit.

12. A method of manufacturing an integrated radar circuit, the method comprising:

providing a first substrate, of a first material, on which is formed an integrated transmit and receive radar circuit;

providing a second substrate, of a second material, comprising at least one through-substrate cavity having cavity walls;

providing at least one discrete transistor chip, of a third material, on which is formed at least one discrete transistor, said at least one discrete transistor chip having chip walls; attaching said at least one discrete transistor chip in said through-substrate cavity with a metal filling extending from at least one cavity wall to at least one chip wall;

forming on said second substrate a conductor electrically connecting a portion of said integrated transmit and receive radar circuit to said discrete transistor; wherein the first material is a first semiconductor material and the third material is a second semiconductor material.

13. The method of claim 12, wherein said attaching said at least one discrete transistor chip in said through-substrate cavity with a metal filling comprises:
temporarily attaching a top surface of said second substrate to a carrier wafer;
temporarily attaching a top surface of said at least one discrete transistor chip to said carrier wafer in said through-substrate cavity;
filling at least a portion of said through-substrate cavity with said metal filling; and
removing said carrier wafer.

14. The method of claim 12, wherein the first and second substrates form a single substrate and the first and second materials are a same semiconductor.

15. The method of claim 14, wherein the first material is Silicon and the third material is a III-V semiconductor.

16. The method of claim 12, comprising forming an antenna on said second substrate, and electrically coupling said antenna to said discrete transistor.

17. The method of claim 12, comprising forming, on said second substrate, passive circuit elements electrically coupled to said discrete transistor, said passive circuit elements, forming an impedance matching circuit.

18. The method of claim 12, wherein said providing at least one discrete transistor chip comprises providing a plurality of discrete transistor chips each attached by the metal filling in the through wafer substrate of the second substrate; and connecting discrete transistors on said discrete transistor chips to form a power amplifier.

19. The method of claim 13, wherein each discrete transistor of a discrete transistor chip comprises a plurality of discrete transistors connected in parallel to a single current input terminal, a single current output terminal, and a single control terminal.

20. The method of claim 18, wherein said attaching said at least one discrete transistor chip in said through-substrate cavity with a metal filling comprises:
temporarily attaching a top surface of said second substrate to a carrier wafer;
temporarily attaching a top surface of each discrete transistor chip to said carrier wafer in said through-substrate cavity;
filling at least a portion of said though-substrate cavity with said metal filling, such that each discrete transistor chip be held in said through-substrate cavity by said metal filling extending from at least one cavity wall to at least one wall of said discrete transistor chip; or extending from at least one wall of said discrete transistor chip wall to at least one wall of a neighboring discrete transistor chip; and
removing said carrier wafer.

* * * * *